(12) United States Patent
Da Rocha Mordente

(10) Patent No.: US 10,724,637 B2
(45) Date of Patent: Jul. 28, 2020

(54) PISTON RING FOR AN INTERNAL-COMBUSTION ENGINE, A METHOD FOR COATING A PISTON RING, AND AN INTERNAL-COMBUSTION ENGINE

(71) Applicants: Mahle Metal Leve S/A, Jundiai (BR); Mahle International GmbH, Stuttgart (DE)

(72) Inventor: Paulo Jose Da Rocha Mordente, Jundiai (BR)

(73) Assignees: Mahle Metal Level S/A (BR); Mahle International GmbH (DE)

( * ) Notice: Subject to any disclaimer, the term of this patent is extended or adjusted under 35 U.S.C. 154(b) by 0 days.

(21) Appl. No.: 16/090,197

(22) PCT Filed: Mar. 29, 2017

(86) PCT No.: PCT/EP2017/057441
§ 371 (c)(1),
(2) Date: Sep. 28, 2018

(87) PCT Pub. No.: WO2017/167817
PCT Pub. Date: Oct. 5, 2017

(65) Prior Publication Data
US 2019/0120379 A1    Apr. 25, 2019

(30) Foreign Application Priority Data
Mar. 31, 2016    (BR) .......................... 1020160071690

(51) Int. Cl.
*F16J 9/26*    (2006.01)
*F16J 9/12*    (2006.01)
(Continued)

(52) U.S. Cl.
CPC ............... *F16J 9/12* (2013.01); *C23C 14/505* (2013.01); *C23C 14/542* (2013.01); *F16J 9/26* (2013.01)

(58) Field of Classification Search
CPC ........ C23C 14/505; C23C 14/542; F16J 9/12; F16J 9/26
See application file for complete search history.

(56) References Cited

U.S. PATENT DOCUMENTS 7,052,019 B2    5/2006 Miida
8,173,248 B2 *  5/2012 Hovsepian .............. C23C 30/00
                                            204/192.11
(Continued)

FOREIGN PATENT DOCUMENTS

CN    107002871 A    8/2017
EP    1359351 A1    11/2003
(Continued)

OTHER PUBLICATIONS

Chinese Office Action dated Aug. 1, 2019 in parallel Chinese Patent Application No. 201780013572.5.

*Primary Examiner* — Gilbert Y Lee
(74) *Attorney, Agent, or Firm* — Fishman Stewart PLLC

(57) ABSTRACT

A piston ring may include a drawn metal base of constant thickness having an outer peripheral surface. The piston ring may also include a hard coating disposed on the outer peripheral surface. The coating may have a thickness that is greater in a region of two butt ends of the base than a thickness of the coating in another region of the outer peripheral surface. The coating may be defined by a plurality of layers with a nanoscale structure.

19 Claims, 4 Drawing Sheets

(51) Int. Cl.
*C23C 14/50* (2006.01)
*C23C 14/54* (2006.01)

(56) References Cited

U.S. PATENT DOCUMENTS

| | | | |
|---|---|---|---|
| 9,759,324 B2* | 9/2017 | Ciminelli Duarte De Souza | F16J 9/26 |
| 10,370,755 B2* | 8/2019 | Lammers | C23C 14/0641 |
| 2004/0056425 A1* | 3/2004 | Miida | C23C 14/505 |
| | | | 277/459 |
| 2008/0260478 A1* | 10/2008 | Hovsepian | C23C 30/00 |
| | | | 407/119 |
| 2012/0228831 A1* | 9/2012 | Herbst-Dederichs | F16J 9/14 |
| | | | 277/434 |
| 2013/0200572 A1 | 8/2013 | Cha et al. | |
| 2013/0307221 A1* | 11/2013 | Esser | F16J 9/12 |
| | | | 277/434 |
| 2015/0329968 A1* | 11/2015 | Tamagaki | C23C 16/4409 |
| | | | 118/723 E |
| 2016/0122862 A1* | 5/2016 | Lammers | C23C 14/0641 |
| | | | 277/443 |
| 2016/0298764 A1* | 10/2016 | Ciminelli Duarte De Souza | F16J 9/26 |
| 2017/0306469 A1* | 10/2017 | Da Rocha Mordente | C23C 14/044 |

FOREIGN PATENT DOCUMENTS

| | | |
|---|---|---|
| WO | WO-2014194874 A1 | 12/2014 |
| WO | WO-2016/055498 A1 | 4/2016 |

* cited by examiner

PISTON RING FOR AN INTERNAL-COMBUSTION ENGINE, A METHOD FOR COATING A PISTON RING, AND AN INTERNAL-COMBUSTION ENGINE

CROSS-REFERENCE TO RELATED APPLICATIONS

This application claims priority to International Patent Application No. PCT/EP2017/057441, filed on Mar. 29, 2017, and Brazilian Patent Application No. 10 2016 007169 0 31, filed on Mar. 31, 2016, the contents of both of which are hereby incorporated by reference in their entirety.

TECHNICAL FIELD

The present invention relates to piston rings for internal-combustion engines in which the outer peripheral surface of the piston ring is provided with a multilayer composite coating, said coating providing high hardness and wear resistance, while guaranteeing low compressive stress, which guarantees optimum durability of the piston ring.

BACKGROUND

Internal-combustion engines basically comprised two main parts: an engine block (provided with one or more cylinders) and a crankshaft assembly that is associated with one or more cylinder heads. The crankshaft assembly contains pistons, connecting rods and the crankshaft and is used to move the pistons inside the cylinders of the engine block. The piston is a cylindrical part, usually made up of a metal base, and includes one or more rings that are used to provide a sliding seal between the outer edge of the piston and the inner wall of the cylinder.

During movement of the piston inside the cylinder, the piston must adhere fully to the walls of the cylinder to prevent the air-fuel mixture and the exhaust gases from leaking out of the combustion chamber into the oil sump during compression and combustion, and to prevent the oil from the sump entering the combustion zone. Due to the high friction that such a solution would cause, the solution found was to design a small gap between the piston and the inner walls of the cylinder and to insert one or more rings around the piston to ensure the required isolation.

Modern four-stroke engines normally use three rings on each piston, specifically two compression rings and one oil ring. The two rings located closest to the piston head are known as compression rings and are intended to ensure that the gas mixture does not leak into the sump when the piston performs the compression movement. The third piston ring is known as the oil ring and is intended to scrape away the excess oil from the wall of the cylinder, controlling the thickness of the oil film.

Piston rings usually comprise a peripheral metal surface to which is applied at least one layer of coating or film that is designed to come into contact with the wall of the cylinder.

The coating plays a fundamental role since it is intended to ensure the ring is subjected to low friction when sliding, and has high wear-resistance, hardness and toughness properties. However, many of these properties are contradictory, and an increase in one of said properties results in a performance loss in another. Furthermore, the stresses applied to the rings vary along the surface of same, i.e. the stresses are not uniformly applied to the rings.

Studies, tests and simulations carried out by the applicant demonstrate that piston rings, specifically compression rings, suffer premature wear around or on the butt ends of the ring.

In this regard, a representative prior art document is U.S. Pat. No. 7,052,019, which refers to a PVD coating that provides a coating layer of variable thickness, the thickness of the coating layer around the butt ends of the ring being 1.5 to 4 times greater than the thickness of the coating layers applied along the region away from the immediate vicinity of the butt ends of the ring.

It should be noted that the coating disclosed in document U.S. Pat. No. 7,052,019 uses only one source of material, which suggests that only one metal evaporation will take place to form nitrides, which results in the formation of a single-layer coating.

The manufacturing process used has a variable rotational speed such that the speed is lowest when the region around the butt ends of the ring are oriented towards the source of coating material, such that the coating is thicker in the region around the immediate vicinity of the butt ends of the ring than in the region opposite the butt ends of the ring. However, this process requires very precise, controlled synchronization during this speed variation, otherwise the variation effect of the thickness of the coating is not achieved.

On the other hand, increasing just one single-layer coating in the region around the immediate vicinity of the butt ends of the ring is not sufficient to guarantee greater durability of the component. As shown in FIG. 2, the thicker the coating layer in the vicinity of the butt ends of the ring, the greater the contact pressure between the butt ends of the ring and the cylinder of the engine block. Combustion generates high temperatures and increases gas pressure, resulting in premature wear, which is further aggravated by low lubrication and contact pressure between the sliding surfaces of the compression ring and this region. Furthermore, the high compressive stress (greater than 1000 Mpa) of the coating disclosed in document U.S. Pat. No. 7,052,019 reduces the durability of the component due to a higher failure rate caused by peeling of the coating.

Document WO2014194874 discloses a piston ring to which is applied, for example, a PVD coating with a variable multi-layer thickness (AlTiN/CrN). However, this prior art document has a drawback resulting from the use of a ring having a cast metal base (steel or iron), which results in the presence of innumerable discontinuities that negatively affects the performance of the ring. An example of this would be the pores and course structures that are usually found in cast materials.

Cast iron has a graphite structure with microscopic sharp edges, which results in lower mechanical strength compared to cold-worked steels, such as steels produced using extended processes.

Equally, the cast steel also has pores and coarse carbides caused by alloying elements, such as Mo, Cr and Nb for example. These coarse carbides have a negative effect on the performance of the product because these hard structures are fragile and act as stress concentrators similar to graphite structures in cast iron.

Consequently, the result of using cast materials (iron or steel) is that the fatigue strength of the piston rings with PVD coatings may be less than rings coated with PVD and produced using wire-form (drawn) steel.

Another advantage of using stronger materials in the structural component of the piston rings is that the thinner sections consequently generate lightweight rings, resulting in more compact components that help to reduce fuel consumption.

Finally, document WO2014194874 does not disclose the use of nanolayers to form a multilayer coating with controlled periodicity that, as will be seen, is a fundamental factor for obtaining greater coating thicknesses and achieving greater durability in the component.

There is therefore a need for a piston ring and a coating method that overcome the problems in the prior art, addressing same and offering additional advantages.

SUMMARY

To do so, the present invention uses a multilayer coating with a nanolaminate structure and with excellent periodicity control of the layers in all of the regions receiving the coating, guaranteeing a variable thickness of the coating of the peripheral surface of the ring, such that the region in the vicinity of the butt ends of the ring has a coating that is thicker than the other regions of the ring that are coated, resulting in a piston ring with high durability due to excellent wear resistance and low sliding friction combined with the high thickness in said more critical region of the ring, defined as the region in the vicinity of the butt ends.

The present invention relates to a product with extended durability using a piston ring designed for use in an internal-combustion engine, that provides the compression ring with a coating made up of nanolayers and with a well controlled periodicity, said coating having a low compressive stress and variable thickness, such that the thickness of the coating applied increases gradually from 90° and 270° towards 0° and 360° respectively. Maximum thickness is reached in the region of 10° and 350°.

The present invention is also intended to provide a physical vapor deposition (PVD) coating method for a piston ring designed for use in internal-combustion engines that includes two subsequent steps in which the first step involves carrying out a deposition of the coating of uniform thickness around the entire peripheral region of the ring, i.e. around 360°. In the second step of the method, the deposition is intended to increase the coating locally in the 270°, 360°, 0° and 90° region.

The objectives of the present invention are achieved using a piston ring having an outer peripheral surface coated with a hard coating, the thickness of which is greater in a region close to the butt ends of the ring than the thickness of the coating in another region of the outer periphery, the hard coating being formed by multiple layers.

The objectives of the present invention are also achieved by a physical vapor deposition (PVD) method used to obtain a piston ring of an internal-combustion engine including the following steps:

Step 1: Attachment of at least one piston ring to a turntable, the at least one piston ring having an opening positioned in front of at least one source of coating material, the turntable performing a first rotational movement about the central axis of same and the at least one ring receiving a first deposition in the region of the peripheral surface defined by the 180° adjacent to the center of the opening by rotating the turntable, Step 2: The turntable performing the first rotational movement in step 1 and the at least one ring performing a second rotational movement on a turntable, the source of coating material causing a second deposition around the entire peripheral surface 0°-360° of the piston ring, and Step 1 and step 2 being alternated and performing the first rotational movement and the second rotational movement in opposite directions (clockwise or counter-clockwise).

The objectives of the present invention are also achieved by an internal-combustion engine including at least one piston ring as defined above.

BRIEF DESCRIPTION OF THE DRAWINGS

The present invention is described in greater detail below on the basis of an example embodiment shown in the drawings. The figures show.

DETAILED DESCRIPTION

Figure 1:
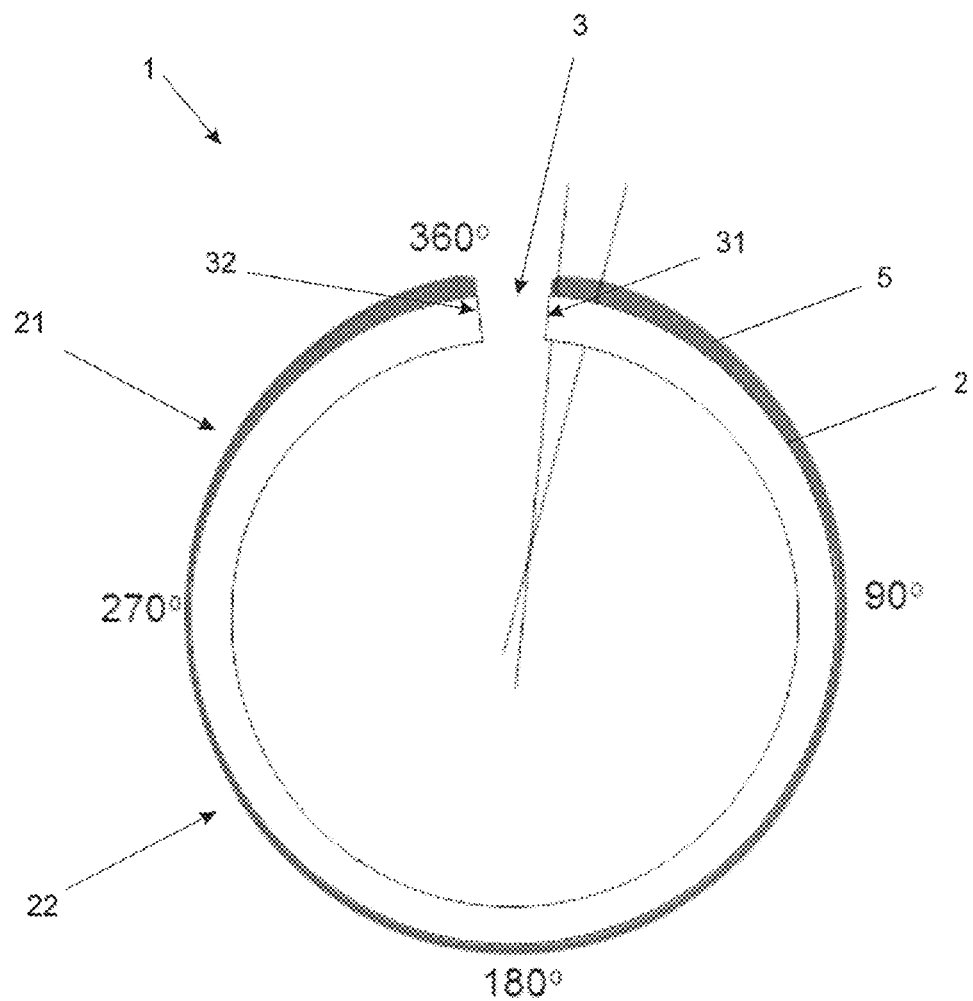
FIG. 1 is a schematic representation of a piston ring obtained using the coating method described in the present invention.
Figure 2:
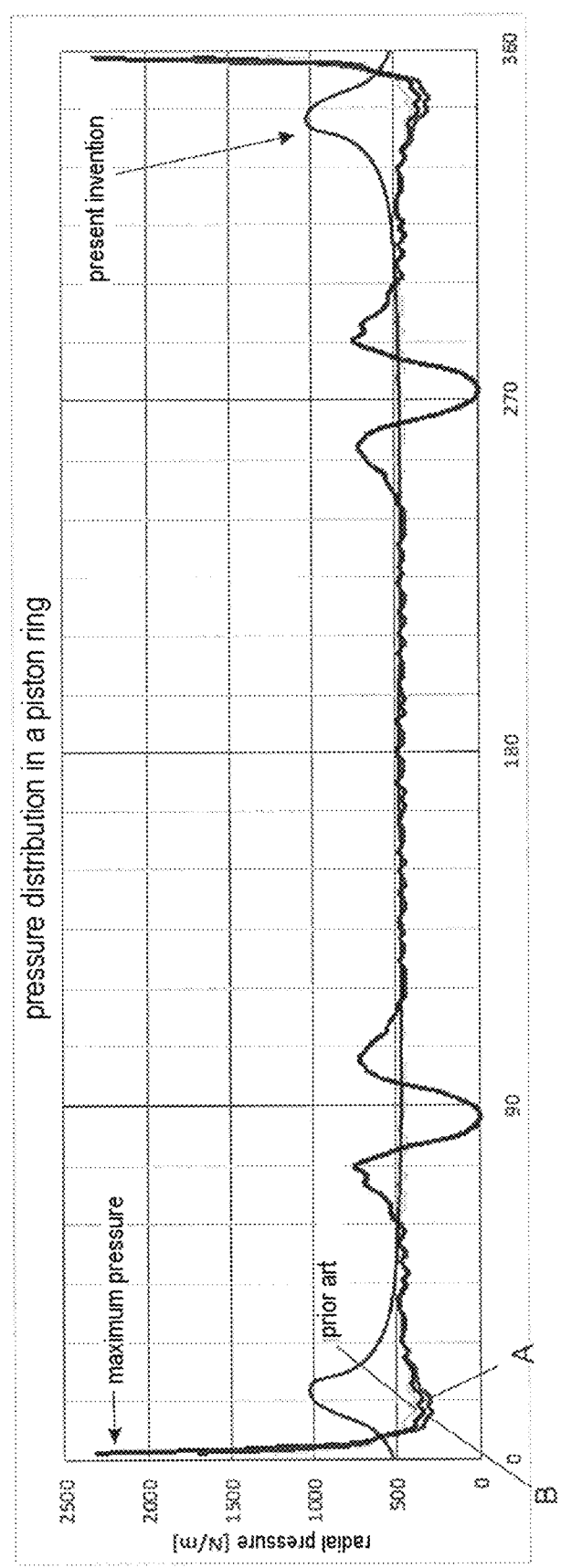
FIG. 2 is a graphical representation of pressure distribution from 0° to 360° for a piston ring.

The present invention refers to a piston ring 1 comprising a drawn metal base of constant thickness and a method for depositing a coating 5 that is intended to guarantee a hard coating 5 formed by multiple layers with a nanolaminate structure and a controlled periodicity that is substantially equal to the full length of the coating 5.

The present invention also relates to a hard coating, 5 the thickness of which is greater in a region close to the butt ends 31, 32 of the ring than the thickness of the coating 5 in another region of the outer peripheral surface of the ring 1. In other words, the present invention refers to a coating 5 with a variable thickness and comprising a plurality of layers of coating 5 deposited on the peripheral surface 2 of the piston ring 1, such that a region adjacent to the immediate vicinity of the butt ends 31, 32 of an opening 3 of the ring 1 includes a layer of coating 5 that is thicker than the layer of coating of the region opposite the immediate vicinity of the butt ends 31, 32 of the ring 1, and, with a reduction in the thickness of the layer of coating 5 of the immediate vicinity of the butt ends 31, 32 of the opening 3 of the ring 1, thereby providing a piston ring 1 with high durability due to the excellent strength and increased thickness in the region of the ring subject to the greatest wear.

As is known, the entire piston ring 1 is provided with an opening 3 that enables the piston ring to be assembled in a groove in a piston of an internal-combustion engine. To better define the present invention, the region of the opening 3 of the ring is defined by two butt ends 31, 32, also known as extremities of the ring 1. Taking the center of the opening 3, for example, it can be assumed that same covers a total of 10°. Thus, the center of the opening 3 is deemed to be 0° or 360°. As such, each butt end is 5° from the center of the opening 3.

In this context, the limit of the first butt end 31 is positioned at 5° from the center of the opening 3 and the limit of the second butt end 32 is positioned at 355° from the center of the opening, or at 5° from said center. To better understand the present invention, the angles should be measured clockwise from the center of the opening 3 of the piston ring 1.

Very simply, as described in greater detail in the remainder of the text, the method according to the present invention involves a first physical vapor deposition (PVD) over substantially half of the peripheral surface 2 of the ring 1, followed by a second physical vapor deposition (PVD) over the entire peripheral surface 2 of the ring 1. The first and second depositions may be alternated.

More specifically, the first deposition is made in the region of the ring 1 comprising of the areas defined by the angles 0° to 90° and 270° to 360°, measured from the center of the opening 3 of the ring 1. Alternatively, the surface receiving the first deposition can be described as the 180° adjacent to the center of the opening 3. These 180° adjacent to the center of the opening are hereinafter referred to as a first half 21 of the ring 1. The opposite portion of the ring 1 is hereinafter referred to as a second half 22 and comprises, naturally, the portion of the peripheral surface 2 defined by the angles 90° to 270°.

As shown in FIG. 1, the piston ring 1 includes a substantially annular metal peripheral surface 2, said surface acting as a sliding portion in the interface between the ring 1 and the cylinder liner. The piston ring 1 described in the present invention preferably includes a compression ring 1 in the first piston groove or a piston ring in the second piston groove.

Notably, the PVD coating method according to the present invention includes a chamber 55 specifically designed for this type of deposition, including at least two sources 52 of different coating materials 53 and at least one turntable 50 onto which at least one piston ring 1 is attached.

The chamber 55 preferably but not necessarily includes an even number of sources 52 of coating material 53. Alternatively, the present invention may have an odd number of sources 52, the choice between two, three, four, five, six, seven, eight, nine, 10, etc. sources 52 depending on each project and requirement. Consequently, in a possible example embodiment shown in FIG. 3, 4 or 5, four sources may be arranged symmetrically and equidistantly such as to enable even deposition on all of the parts to be coated. As a simplistic summary, the number of sources 52 varies independently of the number of rings 1.

There is no limit to the number of rings 1 that can be positioned other than the space available on the turntable, and one or more rings 1 may be positioned. The deposition speed of the coating material 53 is faster with more sources 52, thereby increasing the efficiency of the method.

Figure 3:
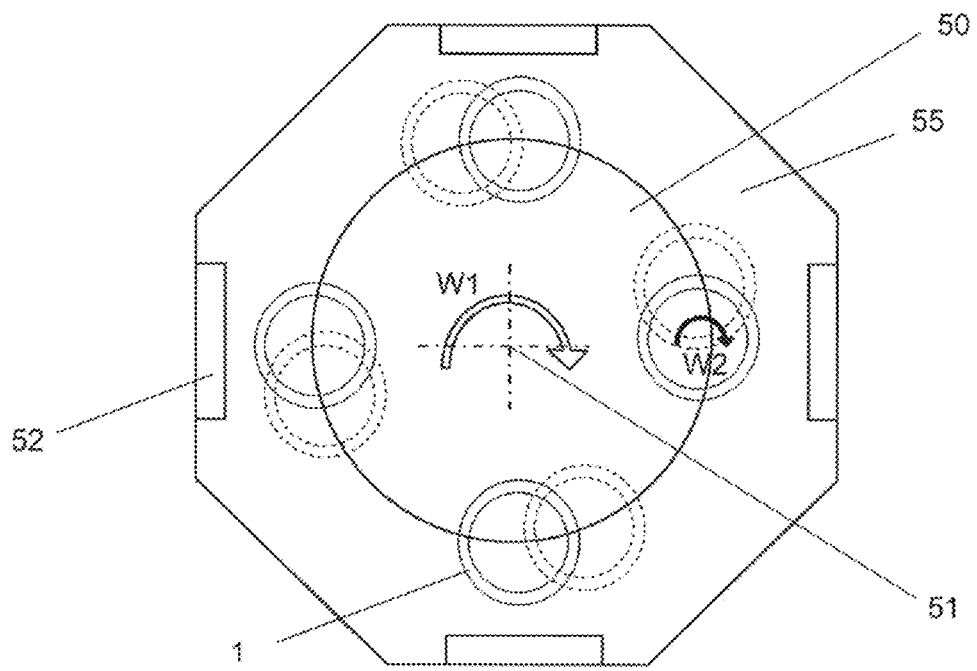
FIG. 3 is a schematic representation of the conventional PVD method.

The turntable 50 may rotate clockwise or counterclockwise. Furthermore, a first rotational movement W1 of the turntable 50 and a second rotational movement W2 of the piston ring 1 may be in alternate directions or the same direction, and may be clockwise or counterclockwise Normally, the PVD method for coating piston rings 1, as shown in FIG. 3, involves attaching at least one ring 1 to a turntable 50 such that the turntable performs a first rotational movement W1 about the central axis 51 of same and the ring 1 performs a second rotational movement W2 on the turntable 50, the ring 1 receiving a deposition of coating material around the entire peripheral surface 2, from 0° to 360°.

In the conventional PVD method, the speed of the rotational movements is kept constant, thereby determining a uniform thickness of the coating 5 around the entire peripheral surface 2 of the piston ring 1.

The PVD method described in the prior art is performed according to the conventional method, but with a variable rotational speed. Consequently, when the first half 21 of the ring 1 is in front of a source 52 of coating material 53, the rotational speed is reduced, thereby ensuring that the first half 21 of the ring 1 has a layer of coating 5 that is thicker than the second half 22 of the peripheral surface 2 of the ring 1.

However, the PVD method in the prior art, in addition to the drawback relating to the precise control of the speed of rotation, also has the drawback of the immediate vicinity of the butt ends 31, 32 of the opening 3 of the ring 1 having a layer of coating 5 that is thicker, thereby increasing the contact pressure between the butt ends 31, 32 of the ring 1 and the cylinder.

The coating method proposed by the present invention includes applying a coating using a PVD method carried out in at least two steps, the execution sequence of which may be alternated.

Figure 4:
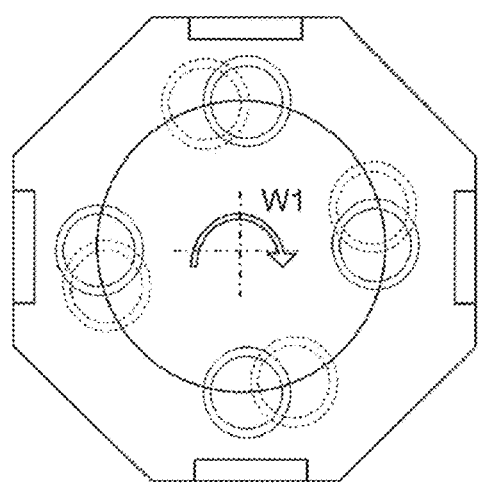
FIG. 4 is a schematic representation of step 1 of the PVD method according to the present invention.

As shown in FIG. 4, in step 1 of the coating method, the piston ring 1 is attached to the turntable 50 such that the first half 21 of the ring 1 is in front of the source 52 of coating material 53. In this step, only the turntable 50 performs the first rotational movement W1 about the central axis 51, while the piston ring 1 remains static in relation to the turntable 50. This first step is intended to apply a first deposition of coating material 53 and applies approximately two-thirds of the final thickness of the layer of coating 5.

Figure 5:
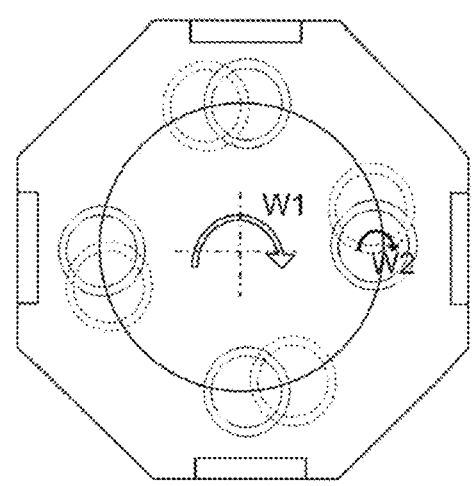
FIG. 5 is a schematic representation of step 2 of the PVD method according to the present invention.

In step 2 of the method, shown in FIG. 5, both the turntable 50 and the piston ring 1 perform rotational movements. The turntable 50 performs a first rotational movement W1 about the central axis 51, while the piston ring 1 performs a second rotational movement W2 on the turntable 50. In this step, a second deposition of a second coating material 53 is applied around the entire peripheral surface 2 from 0° to 360° of the ring 1. Thus, the final thickness of the layer of coating 5 is reached on the first half 21 of the ring 1, being thicker than on the second half 22 of the ring 1. Alternatively, it should be noted that, between step 1 and step 2, the rings may undergo a finishing process, which may be machining, polishing, grinding, lapping, honing, brushing and the like, to guarantee that the thickness of same is substantially constant.

Figure 6:
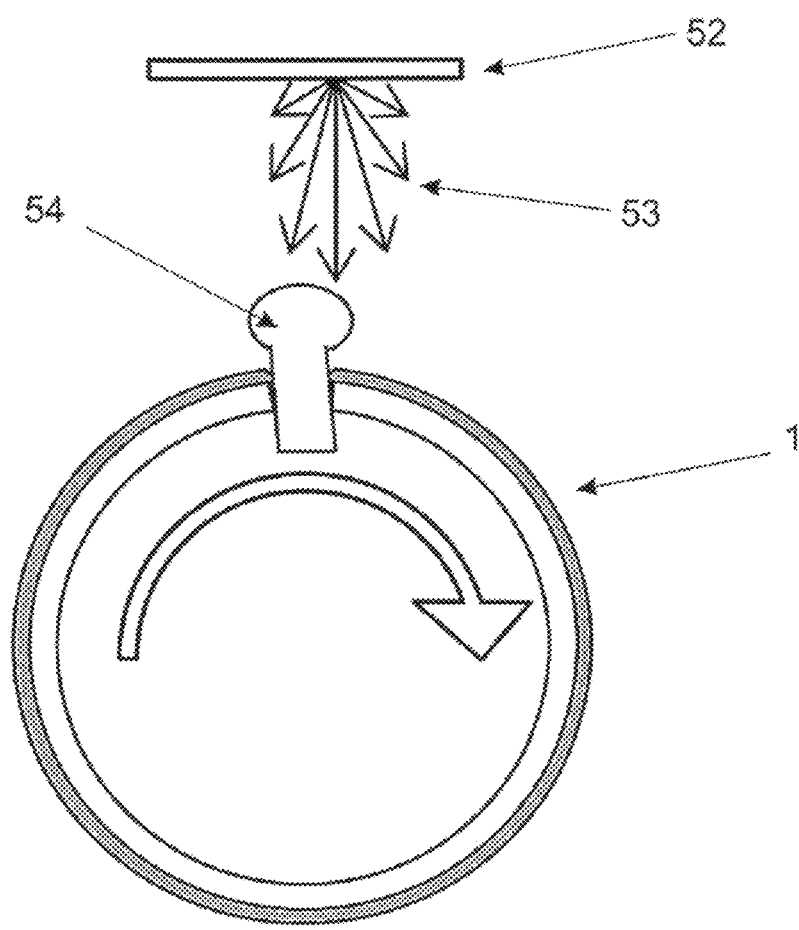
FIG. 6 is a schematic representation of the use of a physical barrier in the PVD method.

FIG. 6 shows how the PVD coating method also ensures that the thickness of the layer of coating 5 in the immediate vicinity of the first butt end 31 and in the immediate vicinity of the second butt end 32 is, preferably but not necessarily, between 2% and 10% less than the thickness of the layer of coating in the regions close to the butt ends 31, 32 of the ring 1.

In a preferred arrangement, a physical barrier 54 is inserted between the butt ends 31, 32 of the opening 3 of the ring 1 such as to obstruct a fraction of the coating material 53 applied by the source 52, thereby achieving a reduction in the thickness of the layer of coating 5 in the immediate vicinity of the first butt end 31 and in the immediate vicinity of the second butt end 32 of the opening 3 of the ring 1.

In a second arrangement, the reduction in the thickness of the layer of coating 5 in the immediate vicinity of the butt ends 31, 32 of the opening 3 may be achieved by performing a machining process in order to remove the material after the coating process. Preferably but not necessarily, the machining processes used may be brushing processes or lapping processes.

Reducing the thickness of the layer of coating in the immediate vicinity of the butt ends 31, 32 is a structural option intended to reduce the contact pressure in order to improve lubrication and consequently reduce wear of the ring 1.

Dividing the PVD coating method into two steps enables the parameters of the method to be adjusted in order to reduce the compressive stresses applied during deposition of the material 53, thereby achieving greater thicknesses of the layer of coating 5.

This device for optimizing the stresses in the layer of coating 5 cannot be achieved in the PVD method known in the prior art. Thus, it is possible to achieve thicknesses greater than the 50 μm described in the prior art, and it is perfectly viable to achieve thicknesses of 70 μm or even of more than 100 μm.

Moreover, the method according to the present invention works with different materials applied during the first and second steps. For example, in the first step a material with a high wear resistance may be applied, while in the second step a material with low sliding friction and less resistance to wear may be applied.

Naturally, the layers that can be applied using PVD methods are not limited to the chemical composition of same, i.e. layers of nitrites, carbides and other compounds can also be applied, for example: CrN, TiN, NbN, CrCN, to form, for example, coatings 5 of CrN/NbN, CrN/CrAlN, a-C/CrN, a-C/ta-C, and the like. The solution set out in this invention is therefore based on a coating 5 obtained by PVD that has a nano metric multilayer architecture, i.e. nanolayers.

It should also be noted that the controlled periodicity of the nanolayers of the coating 5 of the present invention has quite uniform values throughout the entire coating 5 of the ring 1. Given that the periodicity relates to the sum of the thickness between a first layer of a material A and a second layer of a material B, regardless of the fact that the total thickness of the coating 5 according to the present invention varies between the butt ends 31, 32 of the ring 1 (thicker) and the region positioned at 180° (thinner), the periodicity is always the same.

By way of example, for a situation in the prior art in which the region of the butt ends has a periodicity of 45 nm and a coating thickness of 60 μm, the present invention will have a periodicity of 20 nm for the same coating thickness of 60 μm. With regard to the region opposite the butt ends, in the prior art for a periodicity of 20 nm and a coating thickness of 20 μm, the present invention has a periodicity of 20 nm and a coating thickness of 40 μm.

Two advantages result from the structural arrangement of the present invention: firstly that the thicker coating improves the wear resistance and resistance to peeling, making the product more durable, and secondly that the lower periodicity improves the hardness of the coating, which also increases the durability of the product. Consequently, given that lowering the speed W1 and W2 increases the periodicity, the periodicity according to the present invention is equal to or less than 30 nm, this value being notably less than any solution in the prior art for the piston ring according to the present application. It should be noted that the periodicity of the nanolayers according to the present invention may be any value between 1 nm and 30 nm, i.e. less than 25 nm or less than 20 nm or less than 15 nm or less than 10 nm.

It should also be noted that the internal stress of the coating 5 according to the present invention is less than 1000 Mpa, which results in a coating that is more resistant to peeling when compared to the solutions in the prior art (above 1000 Mpa).

These advantages cannot be achieved using the methods described in the prior art, since said methods are continuous and comprise just one step to deposit a coating with a single-layer structure. Consequently, the PVD coating method proposed by the present invention is based on a single technology, but uses a process methodology that is more advantageous and that consequently provides a product providing greater performance at least in terms of durability.

The piston ring 1 obtained using the PVD coating method proposed in the present invention is such that the first half 21 of the ring 1 has a thickness gradient of the layer of coating 5 starting from at least 15 μm at 90° and 270° and ending in at least 15 μm in the regions adjacent to the immediate vicinity of the butt ends 31, 32 of the opening 3. It should be noted that the immediate vicinity of the butt ends 31, 32 has a layer of coating 5 that is approximately 2% to 10% less thick than the regions adjacent to the immediate vicinity of the butt ends 31, 32, and as such the thickness of the immediate vicinity of the first butt end 31 is at least 55 μm and the thickness of the immediate vicinity of the second butt end 32 is at least 55 μm. Furthermore, the second half 22 of the ring, i.e. between 90°, 180° and 270°, has a coating layer of uniform thickness of at least 15 μm.

Although a preferred embodiment has been described, it should be noted that the scope of the present invention covers other possible variations and is only limited by the content of the attached claims, including possible equivalents.

The invention claimed is:

1. A piston ring comprising:
a drawn metal base of constant thickness;
an outer peripheral surface;
a hard coating, a thickness of which is greater in a region of two butt ends of the base than a thickness of the coating in another region of the outer peripheral surface;
wherein the coating is defined by a plurality of layers with a nanoscale structure;
wherein the plurality of layers of the coating include a plurality of first layers and a plurality of second layers; and
wherein the plurality of second layers each extend a greater circumferential distance around the base than each of the plurality of first layers.

2. The piston ring as claimed in claim 1, wherein the plurality of layers of the coating have a same periodicity around the entire base.

3. The piston ring as claimed in claim 1, wherein a periodicity of the plurality of layers is equal to or less than 30 nm.

4. The piston ring as claimed in claim 3, wherein a difference between a thicknesses of each of the plurality of layers in the region of the two butt ends and a region disposed further from the two butt ends is 8 nm or less.

5. The piston ring as claimed in claim 1, wherein the coating has an internal stress of less than 1000 MPa.

6. The piston ring as claimed in claim 1, wherein the coating has a thickness gradient extending from a coating thickness of at least 15 μm at a circumferential angle of 90° and 270° of the base to a coating thickness of at least 55 μm in the region of the two butt ends, and wherein the two butt ends define an opening of the base.

7. The piston ring as claimed in claim 1, wherein:
the two butt ends define an opening of the base;
the base includes (i) a first end region including a first butt end of the two butt ends, (ii) a second end region including a second butt end of the two butt ends, (iii) a first adjacent region disposed directly adjacent to the first end region, and (iv) a second adjacent region disposed directly adjacent to the second end region; and the first end region of the base and the second end region of the base have a coating thickness that is approximately 2% to 10% less thick than a coating thickness in the first adjacent region and the second adjacent region.

8. The piston ring as claimed in claim 7, wherein:
the first adjacent region has a coating thickness of at least 55 μm; and
the second adjacent region has a coating thickness of at least 55 μm.

9. The piston ring as claimed in claim 1, wherein a second half of the base defined between a circumferential angle of 90° and 270° disposed opposite the two butt ends, has a substantially uniform coating thickness of at least 15 μm.

10. The piston ring as claimed in claim 1, wherein the outer peripheral surface is a sliding surface.

11. The piston ring as claimed in claim 1, wherein:
the plurality of second layers each extend completely around the base in a circumferential direction; and
the plurality of first layers each extend only partially around the base in the circumferential direction.

12. The piston ring as claimed in claim 1, wherein the coating in the region of the two butt ends includes a greater number of the plurality of first layers than a region diametrically opposite the two butt ends.

13. The piston as claimed in claim 1, wherein approximately ⅔ of the thickness of the coating in the region of the two butt ends is provided by the plurality of first layers.

14. A physical vapor deposition method for coating a piston ring of an internal-combustion engine, comprising:
attaching at least one piston ring to a turntable such that an opening of the at least one piston ring is positioned in front of at least one source of coating material;
performing a first rotational movement of the turntable about a central axis of the turntable;
receiving a first deposition of coating material on the at least one piston ring in a region of a peripheral surface of the at least one piston ring defined by a 180° circumferential angle disposed adjacent to a center of the opening while performing the first rotational movement to form a coating layer with a nanoscale structure;
performing the first rotational movement of the turntable while performing a second rotational movement of the at least one piston ring on the turntable; and
causing, via the at least one source of coating material, a second deposition of coating material around the entire peripheral surface defined between a circumferential angle of 0° and 360° of the at least one piston ring to form another coating layer with a nanoscale structure, while performing the first rotational movement and performing the second rotational movement;
wherein receiving the first deposition of coating material and causing the second deposition of coating material are alternatingly performed; and
wherein the first rotational movement and the second rotational movement are in opposite directions.

15. The method for coating a piston ring as claimed in claim 14, further comprising positioning a physical barrier between the opening of the at least one piston ring and the at least one source of coating material after at least one of receiving the first deposition of coating material and causing the second deposition of coating material.

16. The method for coating a piston ring as claimed in claim 14, wherein receiving the first deposition of coating material includes providing substantially two-thirds of a final thickness of a coating layer.

17. The method for coating a piston ring as claimed in claim 14, further comprising alternating the coating material between receiving the first deposition of coating material and causing the second deposition of coating material.

18. An internal-combustion engine comprising at least one piston ring including:
a drawn metal base having a constant thickness;
an outer peripheral surface;
two butt ends; and
a hard coating defined by a plurality of layers with a nanoscale structure;
wherein a thickness of the coating in a region of the two butt ends is greater than a thickness of the coating in another region of the outer peripheral surface; and
wherein the coating has a thickness gradient extending from a coating thickness of at least 15 μm at a circumferential angle of 90° and 270° of the base to a coating thickness of at least 55 μm in the region of the two butt ends.

19. The internal-combustion engine as claimed in claim 18, wherein the plurality of layers have a periodicity that is uniform around the entire peripheral surface.

* * * * *

UNITED STATES PATENT AND TRADEMARK OFFICE
CERTIFICATE OF CORRECTION

PATENT NO. : 10,724,637 B2  
APPLICATION NO. : 16/090197  
DATED : July 28, 2020  
INVENTOR(S) : Paulo Jose Da Rocha Mordente It is certified that error appears in the above-identified patent and that said Letters Patent is hereby corrected as shown below:

On the Title Page

At Column 1, item (73) in the Assignees, please change "Level" to "Leve".

Signed and Sealed this
Twenty-fourth Day of November, 2020

Andrei Iancu
*Director of the United States Patent and Trademark Office*